(12) United States Patent
Bergers et al.

(10) Patent No.: US 10,086,968 B2
(45) Date of Patent: Oct. 2, 2018

(54) CONTAINER HANDLING MACHINE WITH DISPLAY

(71) Applicant: KRONES AG, Neutraubling (DE)

(72) Inventors: Andreas Bergers, Pfatter (DE); Markus Zölfl, Metten (DE); Timo Pronold, Regensburg (DE); Wolfgang Hahn, Neutraubling (DE)

(73) Assignee: KRONES AG, Neutraubling (DE)

( * ) Notice: Subject to any disclaimer, the term of this patent is extended or adjusted under 35 U.S.C. 154(b) by 284 days.

(21) Appl. No.: 14/901,179

(22) PCT Filed: Jun. 27, 2014

(86) PCT No.: PCT/EP2014/063662
§ 371 (c)(1),
(2) Date: Dec. 28, 2015

(87) PCT Pub. No.: WO2015/007499
PCT Pub. Date: Jan. 22, 2015

(65) Prior Publication Data
US 2016/0152370 A1    Jun. 2, 2016

(30) Foreign Application Priority Data

Jul. 17, 2013  (DE) .................. 10 2013 214 052

(51) Int. Cl.
*G06K 9/00* (2006.01)
*B65C 9/40* (2006.01)
(Continued)

(52) U.S. Cl.
CPC .................. *B65C 9/40* (2013.01); *B65C 9/00* (2013.01); *G05B 19/409* (2013.01);
(Continued)

(58) Field of Classification Search
CPC ........... B65C 9/40; B65C 9/00; G05B 19/409; G05B 2219/36133; G05B 2219/36152;
(Continued)

(56) References Cited

U.S. PATENT DOCUMENTS 8,127,241 B2 * 2/2012 Blevins ................. G06F 9/4488
715/771
9,158,298 B2  10/2015 Gronbach
(Continued)

FOREIGN PATENT DOCUMENTS

CN         1689754 A      11/2005
CN       101115658 A       1/2008
(Continued)

OTHER PUBLICATIONS

The First Office Action, The State Intellectual Property Office of the People's Republic of China, for application No. 201480040386.7, dated Mar. 13, 2017.
(Continued)

*Primary Examiner* — Jonathan S Lee
(74) *Attorney, Agent, or Firm* — Marshall, Gerstein & Borun LLP

(57) ABSTRACT

A container handling machine for handling containers, such as bottles for example, including a machine protection element which shields active parts of the container handling machine against interventions from the outside, for example by operating personnel, at least during operation and which extends at least partly over a part of the periphery of the container handling machine. A display is integrated into the machine protection element, wherein information, for example on the operating state of the container handling machine, can be displayed on the display.

19 Claims, 4 Drawing Sheets

(51) Int. Cl.
G05B 19/409 (2006.01)
B65C 9/00 (2006.01)
H01L 27/32 (2006.01)
H01L 51/00 (2006.01)

(52) U.S. Cl.
CPC ........ G06K 9/00369 (2013.01); H01L 27/323 (2013.01); H01L 51/0097 (2013.01); G05B 2219/36133 (2013.01); G05B 2219/36152 (2013.01)

(58) Field of Classification Search
CPC ............ G06K 9/00369; H01L 51/0097; H01L 27/323
See application file for complete search history.

(56) References Cited

U.S. PATENT DOCUMENTS

| | | | |
|---|---|---|---|
| 2002/0095235 A1 | 7/2002 | Hosel | |
| 2005/0237343 A1 | 10/2005 | Kanda et al. | |
| 2007/0027561 A1 | 2/2007 | Dirnfeldner | |
| 2007/0033903 A1 | 2/2007 | Gertitschke et al. | |
| 2009/0065578 A1* | 3/2009 | Peterson | G05B 19/048 235/382 |
| 2011/0061347 A1* | 3/2011 | Stoiber | B65C 9/40 53/558 |
| 2012/0290121 A1* | 11/2012 | Gronbach | G05B 19/409 700/180 |
| 2015/0248826 A1* | 9/2015 | Hahn | G05B 19/409 340/539.11 |

FOREIGN PATENT DOCUMENTS

| | | |
|---|---|---|
| CN | 101387882 A | 3/2009 |
| DE | 10055025 A1 | 5/2002 |
| DE | 10325894 A1 | 1/2005 |
| DE | 102004048037 A1 | 4/2006 |
| DE | 102005038718 B3 | 8/2006 |
| DE | 602005000070 T2 | 12/2006 |
| DE | 102005041531 A1 | 3/2007 |
| DE | 102007007576 A1 | 8/2008 |
| EP | 2306254 A1 | 4/2011 |
| EP | 2520993 A2 | 11/2012 |

OTHER PUBLICATIONS

German Search Report for Application No. 102013214052.5, dated Feb. 6, 2014.
International Search Report for Application No. PCT/EP2014/063662, dated Sep. 5, 2014.

* cited by examiner

CONTAINER HANDLING MACHINE WITH DISPLAY

The present application is the US National Phase of International Patent Application No. PCT/EP2014/063662, filed Jun. 27, 2014, which application claims priority to German Patent Application No. 102013214052.5, filed Jul. 17, 2013. The priority application, DE 102013214052.5, is hereby incorporated by reference.

BACKGROUND

The present invention refers to a container handling machine with a display integrated in the machine protection element for displaying information, such as the operating state of the container handling machine.

PRIOR ART

Container handling machines, such as labeling machines or blow molding machines, are sufficiently known from the prior art. It is further known from EP 23 06 254 A1 that a container handling machine may be provided with a mobile display device that is suited for the output of information to the user. The user can carry along said display unit by virtue of its portable design. Furthermore, this publication teaches that the display unit can be advantageously mounted via magnets on parts of the machine to give the user more freedom of movement for instance during repair work.

DE 10055025 A1 further teaches about the provision of display and input devices that are assigned to spinning preparation machines. These are provided according to that publication as relatively simple and inexpensive terminals.

SUMMARY OF THE DISCLOSURE

The present disclosure is directed to improving the options of interaction of an operator of a container handling machine and in facilitating the interactions with the container handling machine.

The container handling machine according to the invention for handling containers, such as bottles, comprises a machine protection element which shields active parts of the container handling machine against interventions from the outside, for example by operating personnel, at least during operation and which extends at least partly over a part of the periphery of the container handling machine, wherein a display is integrated into the machine protection element, wherein information, for example on the operating state of the container handling machine, can be displayed on the display. The display which is provided on the machine protection element permits a display, which is particularly simple for an operator, of information that regards for example the operating state of the container handling machine, and simultaneously provides an interactive interface for the interaction of the operator with the container handling machine.

One embodiment is characterized in that the display is a flexible display, for instance an OLED display. Since the machine protection element is in many cases without a flat surface, but rather corresponds to an outer surface of a cylinder, the use of OLED displays or generally flexible displays is here particularly suited because these can also be placed over the curvature of the machine protection element, and it is still possible to mount said displays also on folding parts of the machine protection element without any damage.

According to one embodiment a user recognition unit is provided that is adapted to recognize the position of a user in the surroundings of the container handling machine, and a control unit is connected to the user recognition unit and the display device so as to output a display or notification on the display device depending on a user's position. A display or notification which is thus for instance moving along with an operator can considerably facilitate refitting work, such as for instance the exchange of a multitude of format parts or settings, because the operator can optimally view a corresponding instruction from different positions at all times.

In one embodiment it is provided that the user recognition unit comprises a camera, and the control unit includes an image recognition module. It is thus possible to implement user recognition with the help of common image recognition software and a corresponding camera.

Furthermore, it may be provided that the control unit comprises an associated memory in which preset display profiles can be stored and the user recognition unit is further adapted to identify a user in the surroundings of the container handling machine, and the control unit is adapted to output a display on the display device depending on the identification of the user and stored display profiles. An individualized display of information, for example about the operating state of the container handling machine, can be implemented in this way. For instance, an instruction for the refitting of a machine can be stored in several languages, said instruction being displayed in response to the user performing the refitting work in the language that is most easily understandable for said person.

Furthermore, the display may extend over a portion of the machine protection element which at least partly comprises a handling module for handling containers. The implementation of the display in the direct vicinity of the container handling machine facilitates work on the container handling module because corresponding information about this container handling module can be displayed to an operator in the direct vicinity thereof.

In one embodiment the display is at least partly configured as a touch display and/or a user can interact with the display via a mobile terminal connected to the control unit. An interaction with the display is considerably facilitated by both the touch display and the mobile terminal.

Moreover, the machine protection element can consist at least partly of plexiglass, and/or the display can extend over at least 10%, preferably 20%, particularly preferably 50%, of the area of the machine protection element. Depending on the intended use of the display, the display need not extend over the whole area of the machine protection element, but parts thereof are enough. An inexpensive and simultaneously maximally efficient design of the display can thereby be implemented.

In one embodiment the container handling machine is configured as an outfitting machine for containers, for instance as a labeling machine.

In one embodiment the container handling machine is configured as a block machine consisting of a plurality of individual machines.

With the use of the device of the present disclosure it is possible to realize a method for displaying information that for instance indicates the operating state of a container handling machine, wherein the information is displayed on a display integrated in the machine protection element of the container handling machine. The representation of the information on said display makes it easier for a user to operate the container handling machine.

One embodiment is characterized in that a user in the surroundings of the container handling machine is recognized by means of a user recognition unit, and a display on the display device is controlled via a control unit depending on the user's position. A representation on the display that depends on the user or his/her position can minimize or altogether dispense with unnecessary work routes during refitting or during other work carried out at the container handling machine (for instance moving to and fro between a central terminal and the container handling machine), whereby an operator's work is considerably facilitated.

It may be provided that the user recognition unit identifies the user, and the display on the display device is controlled by the control device depending on the identification of the user and depending on profiles stored in a memory. The representation of information on the display device depending on corresponding user profiles may further help to make an operator's handling of the container handling machine more efficient.

In one embodiment the method is characterized in that the control unit changes in real time the position and/or form of representation of the display on the display device according to a change in the user's position. A concurrent display on the display device enables the operator at any time to have the desired information suitably displayed.

In one embodiment the display on the display device is changed by the control unit by interaction of a user via the display device designed as a touch display and/or a mobile terminal with the control unit. This configuration facilitates interaction with the display. The configuration as a touch display can here offer a great variety of possible interactions of a user with the container handling machine, whereas a mobile terminal further offers the advantage that an operator can also interact with the display from a position where although said person can see the display, he/she cannot operate the display.

DETAILED DESCRIPTION

Figure 1A:
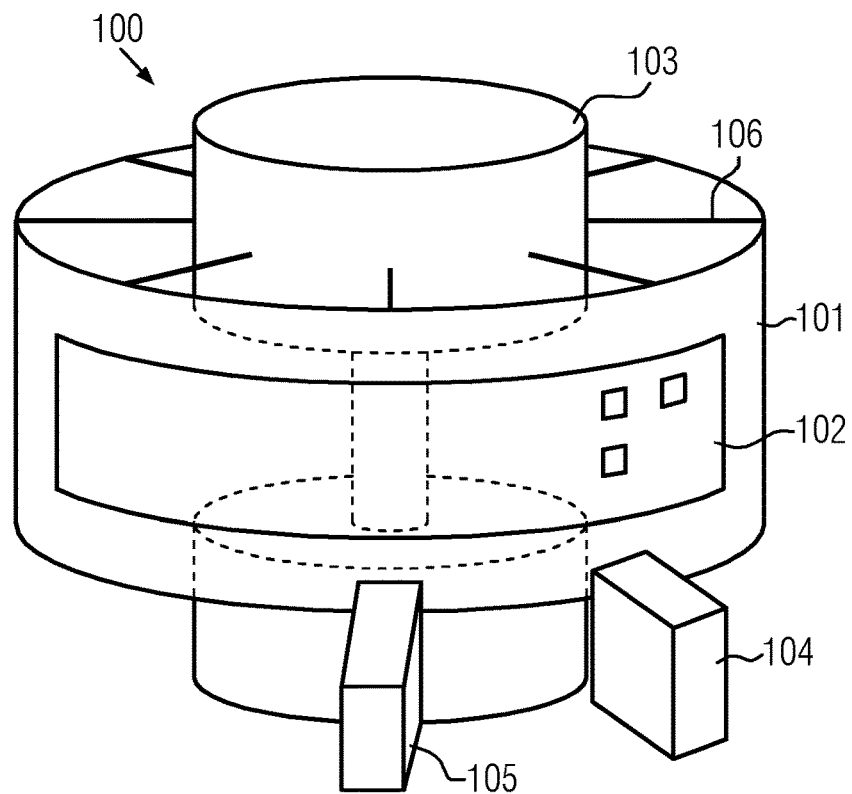
FIG. 1a is a schematic illustration of a container handling machine according to the invention.

FIG. 1a shows a schematic representation of a container handling machine 100 according to the invention. The machine normally comprises an area 103 that is used for handling containers. This may for instance be a labeling or direct-printing machine, wherein in the area 103 the containers are labeled or printed on. Handling modules 104 and 105, such as labeling units, may be provided for this purpose. Other embodiments are also conceivable; for instance, the container handling machine 100 may be a general outfitting machine for containers or a block machine which may be composed of many individual machines.

Furthermore, the container handling machine 100 comprises a machine protection element 101 which may e.g. be connected via rigid connections 106 to the handling part of the container handling machine 103. The machine protection element 101 may here extend over the whole periphery or a part of the container handling machine 100. If the machine is for instance configured as a rotary machine, this means that the machine protection element is provided over the whole circumference, as is for instance shown here, in the form of a cylinder surface. It may also be intended that the machine protection element is only arranged in specific areas on the periphery of the container handling machine to prevent an inadvertent intervention of a user during the operation of the container handling machine. Furthermore, the form of the machine protection element 101 which is here shown is not imperative in this form. The cylinder surface as is shown here may for instance include indentations or bulges so as to be able to receive additional elements, such as the handling modules 104 and 105. To even further facilitate this situation, the machine protection element 101 is most of the time configured to be liftable and/or can be pivoted away.

Furthermore, the machine protection element comprises a display 102 mounted thereon. This display is configured to have an area as large as possible and occupies at least 10%, preferably 20%, preferably 50% or more, of the area of the machine protection element 101. This display is configured in the form of a flexible display, such as an OLED display. Since the machine protection element 101 normally consists of plexiglass or similar transparent materials, it may be provided that the display 102 is arranged between two transparent panels to protect it against environmental influences.

Figure 1B:
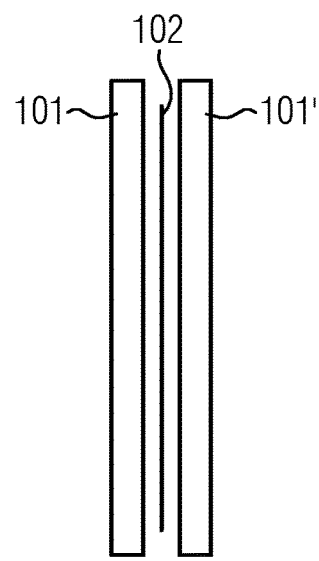
FIG. 1b is another schematic illustration of a container handing machine according to the invention.

A corresponding embodiment is shown in FIG. 1b. The display 102 is here arranged between the transparent panels 101 and 101' of the machine protection element 101 of FIG. 1. It may be provided that the additional panel 101' is only provided in the area of the machine protection element 101 in which the display 102 is provided. Manufacturing costs can thereby be saved.

It should be noted that the machine protection element 101 is not transparent by necessity. In such a case the additional panel 101' covering the display 102 would be of a different material that must be transparent at any rate to ensure the visibility of a display or notification of the display 102. For instance, it may be provided that the additional panel 101' consists of scratch-proof glass or plastic independently of whether the machine protection element consists of plexiglass or of an opaque material. For instance, the display can be protected against soiling and scratching, which considerably enhances its durability.

Information that might be important for the operation of the container handling machine 100 can be displayed on the display itself. This is in general information about the operating state of the container handling machine. For example in the case of the labeling machine, without being restricted thereto, this may be rotational speeds for the rotary machine, label type, number of existing labels, number of rejects, or the like. The display 102 can particularly be used to give the operating personnel corresponding instructions and information in the case of refitting work, for instance type change.

Figure 2A:
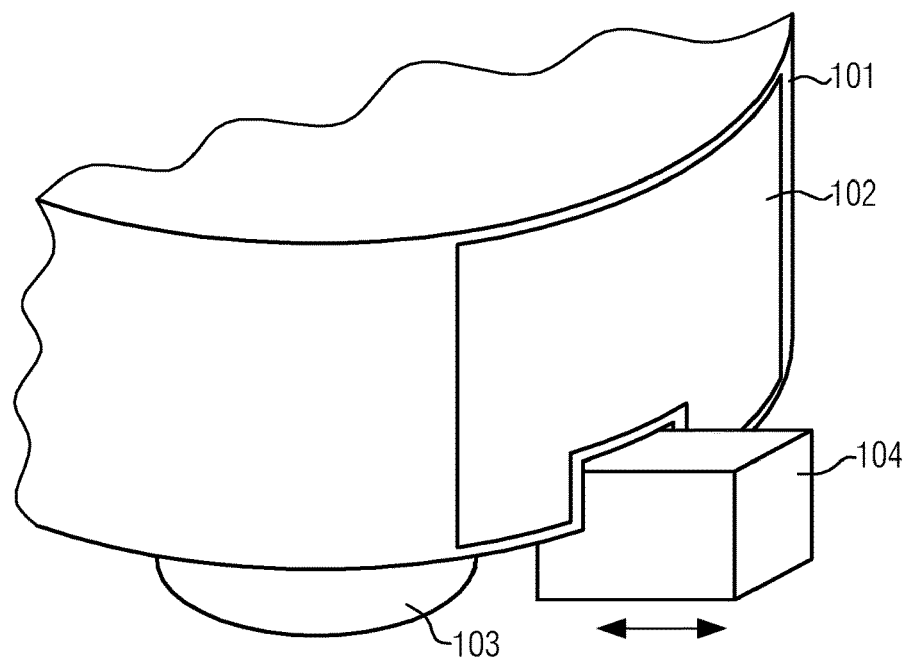
FIG. 2a is a schematic illustration of another embodiment of the machine protection element.

For this purpose FIG. 2a shows an embodiment of the display 102. The arrangement of the machine protection element 101 in relation to the part 103 of the container handling machine that handles the containers is here shown by analogy with that in FIG. 1. The display 102, however, extends in a selective manner over a portion in which a handling module 104 is arranged. In that portion the display 102 may be designed such that it gives the operator specific information about the handling module 104. Furthermore, the machine protection element and the display are configured such that the handling module 104 can be exchanged without any additional removal of the machine protection element 101 and of the display 102. It is thus easier for the operating personnel to exchange the handling module 104 because a corresponding instruction can be permanently displayed via the display 102 while the handling module 104 is exchanged. Such a display can also be assigned to further handling modules or provided at specific places of the container handling machine. For instance, the machine protection element 101 may possibly comprise not only one display 102, but a plurality thereof. Corresponding displays could then assume special functions, such as the display of information or instructions for a specific handling module and/or general information about the state of the total container-handling machine.

Figure 2B:
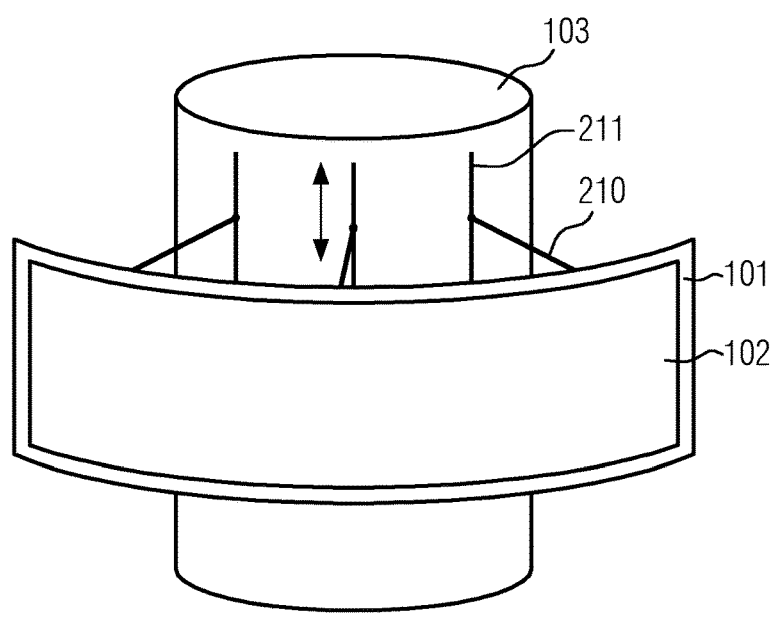
FIG. 2b is a schematic illustration of yet another embodiment of the machine of the present disclosure.

Furthermore, FIG. 2b shows an embodiment of the machine protection element 101 with movable connections to the container handling machine and particularly to the container-handling part 103. The connections preferably comprise guides 211 and connection elements 201 embedded therein, which establish a connection between the machine protection element 101 and the guides 211. For instance, a height adjustability of the machine protection element 101 is achieved, which may be advantageous in the case of refitting or repair work particularly on the container-handling part 103 of the handling machine because the whole machine protection element 101 with display 102 does thus not have to be dismantled, but said element can simply be displaced vertically, whereby the display can further display information about the container handling machine. It is here particularly advantageous when the display or notification on the display device is changed depending on the position of the machine protection element. For instance, if the machine protection element together with the display device is moved upwards by a distance h, the display or notification on the display device can be shifted in the direction of the lower edge of the display device by a distance h, so that it always seems to be at the same height (for instance at the head height) to an operator. If in the case of this change in representation a part of the information to be displayed has to be displayed underneath the lower display edge, the display or notification can still be changed such that the pieces of information are displayed partly next to one another so as to prevent the shifting of information "out of the display". The design of the connection between machine protection element and container handling machine in the form shown in FIG. 2b is only one possible embodiment. It may also be provided that the connection elements 210 are rigidly connected to the container handling machine, such as the container-handling part 103, and the guides 211 are embedded in the machine protection element.

Figure 3:
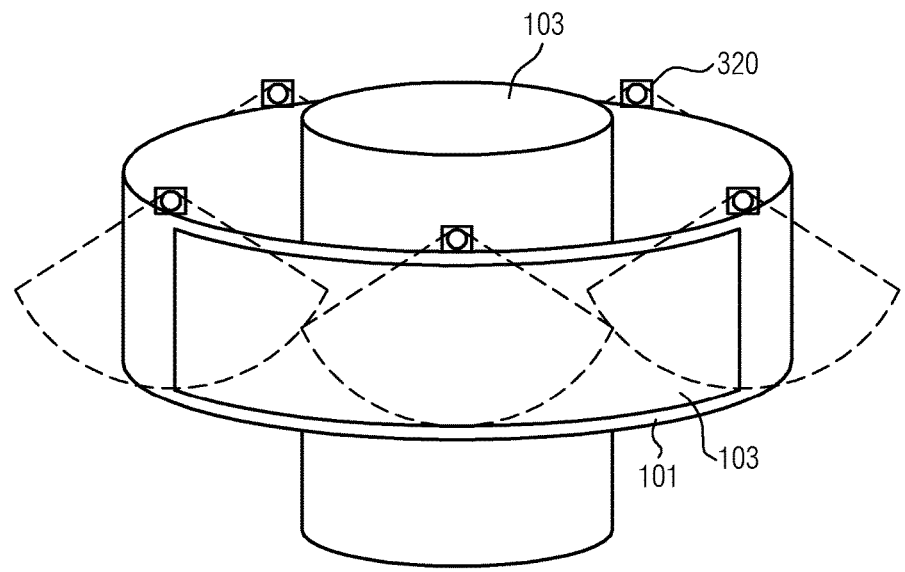
FIG. 3 is a schematic illustration of a device for user recognition.

FIG. 3 shows a further embodiment of the container handling machine according to the invention. In this embodiment a plurality of user recognition units 320 are attached to the machine protection element 102. Preferably, these are plural user recognition units that are arranged such that a person who is in the vicinity of the machine protection element 101 (for instance at a distance of less than 5 or less than 3 or less than 2 m) is recognized, no matter where said person is standing in relation to the machine protection element. This means in the case where the machine protection element is provided over the whole circumference around the container handling machine that the user recognition units must be distributed such that they can recognize a person on the whole circumference of the machine protection element. This user recognition unit is adapted to recognize at least the position of the user in the direct vicinity of the container handling machine. The data obtained thereby can then be transmitted to a control unit. The control unit can then e.g. change the display on the display device depending on the user's position. For instance, if it is intended that the display device permanently displays the current operating parameters (speed, frequency of rejects, or the like) in a specific area, but a user is approaching the container handling machine such that person cannot recognize that part of the display device, the control unit can change the display on the display device according to the data transmitted by the user recognition unit such that it can be recognized by the user. This e.g. includes changes in the position of said special display or notification, but also form and font size.

While the user recognition unit can be designed in principle in any desired manner (it may e.g. be a commercially available motion detector), the design of the user recognition unit with the help of a camera or a plurality of cameras 320 offers further advantages. If the control unit already described further above is adapted to process recorded image data by the camera and if it has an image recognition module with which face recognition is possible, the application possibilities of the display 102 are more comprehensive. For instance, it may be provided that the control unit has a memory assigned to the unit, in which user profiles are stored, the user profiles containing e.g. certain biometric data on face recognition for a plurality of users. Data of relevance to the work thereof with the container handling machine can additionally be stored in the profile. For instance, employee A may come from an English-speaking country, whereas employee B is from China. Since it is basically easier to understand instructions in one's mother language, it may be provided that the control unit decides after having successfully recognized the face of a specific employee whether the display on the display device is to be displayed in another language. For instance, the control unit can switch the display of the display device to English if person A is approaching the container handling machine or to Chinese if employee B is approaching the container handling machine. The user's interaction with the container handling machine is thereby considerably facilitated and operations can be carried out more efficiently and without any errors, if possible.

Owing to face recognition one also achieves a further advantage. For instance, the viewing direction of the user in the surroundings of the container handling machine can be recognized by way of face recognition and with corresponding image recognition software.

Figure 4A:
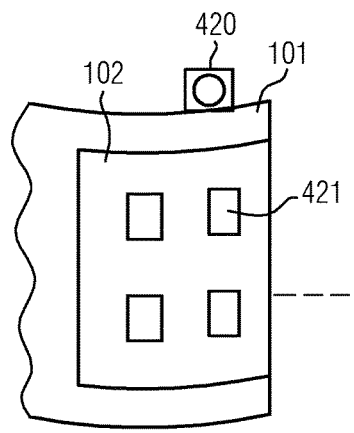
FIG. 4a is a schematic illustration of a display on the display device according to an embodiment, with a user looking from a direction perpendicular to the display
Figure 4B:
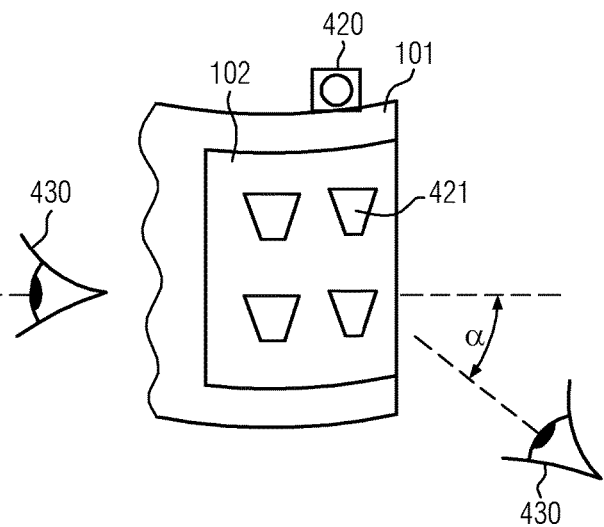
FIG. 4b is a schematic illustration of a display similar to that of FIG. 4a, but with an operator looking obliquely at the display, from below the display.

In this respect FIGS. 4a and 4b illustrate shows two possible viewing angles at which a user 430 is viewing the display 102 on the machine protection element 101. According to FIG. 4a the viewing direction of the user 430 is perpendicular to the display 102. Geometric forms represented in a standard way, here for instance squares 421, can be recognized by the user 420 without any problems from that position.

According to FIG. 4b, however, the operator looks obliquely from below at a specific angle onto the display 102, so that the surface normal of the display and the viewing direction of the viewer 430 enclose an angle α. When a person is for example looking at a writing or geometric form on a flat surface in vertical direction and at a specific angle, it is much more difficult to recognize and clearly identify the corresponding forms. However, since this may specifically be required for refitting work of the container handling machine to definitely identify specific components, the image recognition software of the control unit may be used to change the display on the display device 102 such that the geometric forms 421' are changed such that the viewer 430 is again able from his/her changed viewing angle to recognize structures as in FIG. 4a. To this end it may for example be provided that the displays on the display 102 are distorted depending on the viewing angle at which a user is looking at the display 102. For instance, if a typeface (an instruction for refitting the handling machine) is displayed on the display 102, the lines closer to the viewer can be displayed in the standard font size whereas lines more remote from the viewer are represented in a larger font.

The interaction with the display 102 does not have to be exclusively restricted to the viewing of the information displayed on said display. It may also be provided that the whole control of the container handling machine or at least a part thereof can be carried out by operating the display 102 and thus through interaction with the control unit. The display 102 may e.g. be designed as a touch display. It may also be provided that not the whole display 102, but parts thereof are designed as a touch display or that a mobile terminal is given to a user, with which the user can directly access the control unit. The mobile terminal may e.g. be designed in the form of a tablet computer or a laptop. By operation of the touch display and/or the mobile terminal the display on the display device can then be changed, and or the container handling machine can be controlled in a targeted manner.

Figure 5A:
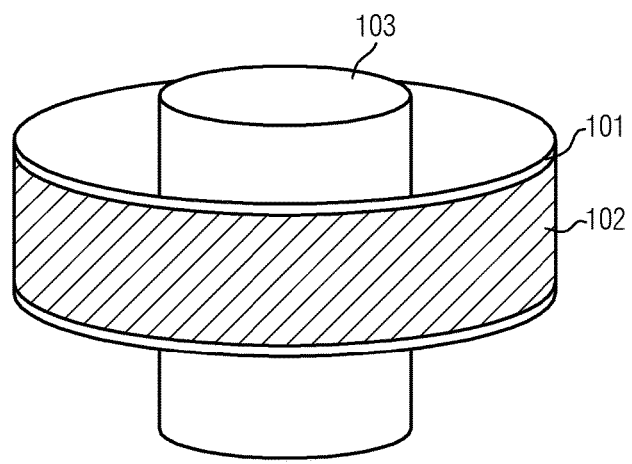
FIG. 5a is a schematic illustration of a further embodiment of the machine protection element.
Figure 5B:
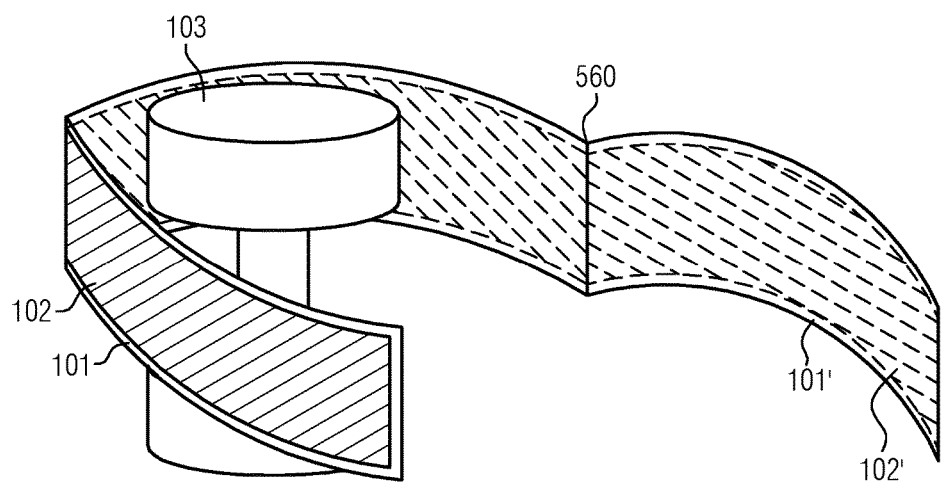
FIG. 5b is a schematic illustration of the machine protection element of FIG. 5a, in an open position.

FIGS. 5a and 5b illustrate shows a further embodiment of the container handling machine. The advantage of the use of flexible displays, such as OLEDs, is here particularly apparent. In FIG. 5a the machine protection element with the display 102 mounted thereon is in its operative state. It protects the interior of the container handling machine or the part 103 handling the containers against external influences, such as e.g. an inadvertent gripping by a user. At the same time the risk of injuries to users is thereby reduced. If the machine is however at a standstill, for instance for refitting purposes, it may be necessary to carry out operations also in the area protected by the machine protection element 101. To this end it may be provided that the machine protection element 101, as shown in FIG. 5b, can be opened like a door. On the door 101', a further display 102' may even be advantageously provided on the inside of the machine protection element to continue necessary displays at that place and make them directly accessible to the user. When flexible displays, such as OLED displays, are used and when the door is opened on the edge 560 around which the door 101' is pivoted, the display does not get damaged; that is why the display can also extend over said portion without any problems. When the machine protection element 101 is opened, an electrical signal can be transmitted to the control unit via a corresponding closing mechanism, with the control unit then automatically switching to the interior display 102' and displaying important information at that place to a user.

The invention claimed is:

1. A container handling machine for handling containers, comprising a machine protection element which shields active parts of the container handling machine against interventions from the outside at least during operation and which extends at least partly over a part of the periphery of the container handling machine, and a display integrated into the machine protection element, wherein information, on the operating state of the container handling machine, can be displayed on the display and further comprising a user recognition unit that is suitable to recognize a position of a user in a vicinity of the container handling machine, and a control unit in operable communication with the user recognition unit and the display so as to output a display on the display depending on a user's position.

2. The container handling machine according to claim 1, the display being a flexible display.

3. The container handling machine according to claim 1, the user recognition unit comprising a camera and the control unit including an image recognition module.

4. The container handling machine according to claim 1, the control unit comprises an associated memory in which preset display profiles can be stored, and the user recognition unit suitable to identify a user in the vicinity of the container handling machine and the control unit being suitable to output a display on the display depending on the identification of the user and stored display profiles.

5. The container handling machine according to claim 1, the display extending over a portion of the machine protection element which at least partly comprises a handling module for handling containers.

6. The container handling machine according to claim 1, the display at least partly configured as a touch display.

7. The container handling machine according to claim 1, the machine protection element comprising at least partly of plexiglass.

8. The container handling machine according to claim 1, wherein the container handling machine is an outfitting machine for containers.

9. The container handling machine according to claim 1, wherein the container handling machine is a block machine including a plurality of individual machines.

10. A method for displaying information that indicates an operating state of a container handling machine, comprising displaying the information on a display integrated in the machine protection element of the container handling machine and further comprising recognizing a user in a vicinity of the container handling machine by means of a user recognition unit and controlling a display on the display via a control unit depending on a user's position.

11. The method according to claim 10, further comprising identifying the user via the user recognition unit and controlling the display on the display by the control unit depending on the identification of the user and depending on profiles stored in a memory.

12. The method according to claim 10, wherein the control unit changes in real time, at least one of a position form of representation of the display on the display according to a change in the user's position.

13. The method according to claim 10, wherein, characterized in that the display on the display is changed by the control unit by interaction of a user via at least one of a touch display of the display or a mobile terminal in communication with the control unit.

14. The container handling machine according to claim 2, the flexible display being an OLED display.

15. The container handling machine of claim 6, further comprising a mobile terminal in communication with the control unit, the mobile terminal permitting user interaction with the display.

16. The container handling machine of claim 1, further comprising terminal in communication with the control unit, the mobile terminal permitting user interaction with the display.

17. The container handling machine of claim 7, wherein the display extends over at least 10% of the area of the machine protection element.

18. The container handling machine of claim 1, wherein the display extends over at least 10% of the area of the machine protection element.

19. The container handling machine according to claim 8, wherein the container handling machine is a labeling machine.

\* \* \* \* \*